US011670518B2

(12) United States Patent
Jin

(10) Patent No.: US 11,670,518 B2
(45) Date of Patent: Jun. 6, 2023

(54) METHOD OF MANUFACTURING SEMICONDUCTOR PACKAGE HAVING CONNECTION STRUCTURE WITH TAPERING CONNECTION VIA LAYERS

(71) Applicant: SAMSUNG ELECTRONICS CO., LTD., Suwon-si (KR)

(72) Inventor: Han Na Jin, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 28 days.

(21) Appl. No.: 17/368,486

(22) Filed: Jul. 6, 2021

(65) Prior Publication Data

US 2021/0335717 A1 Oct. 28, 2021

Related U.S. Application Data

(63) Continuation of application No. 16/571,723, filed on Sep. 16, 2019, now Pat. No. 11,088,081.

(30) Foreign Application Priority Data

Oct. 2, 2018 (KR) .......................... 10-2018-0117697

(51) Int. Cl.
*H01L 21/48* (2006.01)
*H01L 21/56* (2006.01)
(Continued)

(52) U.S. Cl.
CPC ........ *H01L 21/4853* (2013.01); *H01L 21/486* (2013.01); *H01L 21/4857* (2013.01);
(Continued)

(58) Field of Classification Search
CPC ............... H01L 21/4853; H01L 21/486; H01L 21/4857; H01L 21/568; H01L 21/6835; H01L 23/5386
See application file for complete search history.

(56) References Cited

U.S. PATENT DOCUMENTS 9,006,030 B1 4/2015 Kwon et al.
9,704,790 B1 7/2017 Wu et al.
(Continued)

FOREIGN PATENT DOCUMENTS

JP 2010-157690 A 7/2010
JP 2014-154800 A 8/2014

OTHER PUBLICATIONS

Communication dated Oct. 13, 2020, issued by the USPTO in counterpart U.S. Appl. No. 16/454,304.
(Continued)

*Primary Examiner* — Michael Jung
(74) *Attorney, Agent, or Firm* — Sughrue Mion, PLLC

(57) ABSTRACT

A semiconductor package includes: a connection structure having first and second surface opposing each other and including a plurality of insulating layers, a plurality of redistribution layers, and a plurality of connection vias; at least one semiconductor chip on the first surface having connection pads electrically connected to the plurality of redistribution layers; an encapsulant on the first surface encapsulating the at least one semiconductor chip; and UBM layers including UBM pads on the second surface and UBM vias connecting a redistribution layer. At least one connection via adjacent to the first surface has a tapered structure narrowed toward the second surface, and the other connection vias and the UBM vias have a tapered structure narrowed toward the first surface.

20 Claims, 18 Drawing Sheets

(51) Int. Cl.
  *H01L 21/683* (2006.01)
  *H01L 23/538* (2006.01)
  *H01L 23/00* (2006.01)
  *H01L 23/31* (2006.01)
  *H01L 23/498* (2006.01)
  *H01L 25/065* (2023.01)
  *H01L 25/18* (2023.01)

(52) U.S. Cl.
  CPC ........ *H01L 21/568* (2013.01); *H01L 21/6835* (2013.01); *H01L 23/3185* (2013.01); *H01L 23/49816* (2013.01); *H01L 23/49894* (2013.01); *H01L 23/5383* (2013.01); *H01L 23/5386* (2013.01); *H01L 24/05* (2013.01); *H01L 24/16* (2013.01); *H01L 24/32* (2013.01); *H01L 24/73* (2013.01); *H01L 25/0655* (2013.01); *H01L 25/18* (2013.01); *H01L 24/81* (2013.01); *H01L 24/83* (2013.01); *H01L 24/92* (2013.01); *H01L 2221/68345* (2013.01); *H01L 2221/68359* (2013.01); *H01L 2221/68372* (2013.01); *H01L 2224/0401* (2013.01); *H01L 2224/05571* (2013.01); *H01L 2224/16227* (2013.01); *H01L 2224/16238* (2013.01); *H01L 2224/32225* (2013.01); *H01L 2224/73204* (2013.01); *H01L 2224/81005* (2013.01); *H01L 2224/83005* (2013.01); *H01L 2924/1432* (2013.01); *H01L 2924/1434* (2013.01)

(56) References Cited

U.S. PATENT DOCUMENTS

| | | | |
|---|---|---|---|
| 9,935,072 B2 | 4/2018 | Jeong et al. | |
| 10,008,393 B2 | 6/2018 | Kim et al. | |
| 10,026,668 B1 | 7/2018 | Lee et al. | |
| 10,446,478 B2 | 10/2019 | Jeong et al. | |
| 10,453,790 B2 | 10/2019 | Park et al. | |
| 2009/0224391 A1* | 9/2009 | Lin | H01L 24/18 438/106 |
| 2009/0283903 A1 | 11/2009 | Park | |
| 2010/0200279 A1 | 8/2010 | Kariya et al. | |
| 2011/0198749 A1 | 8/2011 | Lee et al. | |
| 2014/0225275 A1 | 8/2014 | Shimizu et al. | |
| 2015/0380334 A1 | 12/2015 | Hu et al. | |
| 2016/0079190 A1 | 3/2016 | Yu et al. | |
| 2016/0086902 A1 | 3/2016 | Lu et al. | |
| 2016/0233153 A1 | 8/2016 | Kidwell, Jr. | |
| 2016/0284620 A1 | 9/2016 | Hu | |
| 2017/0207180 A1 | 7/2017 | Arai et al. | |
| 2017/0323853 A1 | 11/2017 | Hu et al. | |
| 2017/0372998 A1 | 12/2017 | Chen | |
| 2018/0082933 A1* | 3/2018 | Ko | H01L 21/568 |
| 2018/0082993 A1* | 3/2018 | Bobde | H01L 21/266 |
| 2018/0158766 A1 | 6/2018 | Chang Chien et al. | |
| 2018/0233443 A1 | 8/2018 | Sung et al. | |
| 2019/0131223 A1 | 5/2019 | Chang et al. | |
| 2020/0075488 A1 | 3/2020 | Wu | |
| 2020/0111730 A1 | 4/2020 | Heo | |
| 2020/0194362 A1 | 6/2020 | Park | |
| 2020/0194393 A1 | 6/2020 | Wu | |
| 2020/0203280 A1 | 6/2020 | Wang | |
| 2020/0273829 A1 | 8/2020 | Hsu | |

OTHER PUBLICATIONS

Communication dated May 4, 2020, from the European Patent Office in counterpart European Application No. 19210744.9.
Office Action dated Feb. 26, 2021 by the U.S. Patent and Trademark Office in corresponding U.S. Appl. No. 16/454,304.

* cited by examiner

I-I'

II – II'

METHOD OF MANUFACTURING SEMICONDUCTOR PACKAGE HAVING CONNECTION STRUCTURE WITH TAPERING CONNECTION VIA LAYERS

CROSS-REFERENCE TO RELATED APPLICATIONS

This application is a continuation of U.S. application Ser. No. 16/571,723, filed Sep. 16, 2019, which claims benefit of priority to Korean Patent Application No. 10-2018-0117697 filed on Oct. 2, 2018 in the Korean Intellectual Property Office, the disclosures of which are incorporated herein by reference in their entireties.

TECHNICAL FIELD

The present disclosure relates to a semiconductor package.

BACKGROUND

In accordance with improvement of specifications of a set and use of a high bandwidth memory (HBM), the interposer market has grown. Currently, silicon is been mainly used as a material of interposers, but development of a glass or organic method has been conducted in order to increase an area and reduce costs.

Meanwhile, an interposer package is manufactured by performing a package process of attaching a die to the interposer and molding the die, and a connection structure that is to be used as an interposer and has a redistribution layer is manufactured before a semiconductor chip is mounted. However, in a build-up process of the redistribution layers for such a connection structure, undulation may severely occur. Particularly, it is difficult to maintain a critical dimension of a redistribution layer to be formed subsequently. Resultantly, reliability of the package may be significantly decreased.

SUMMARY

An aspect of the present disclosure may provide a semiconductor package in which an undulation problem occurring in a build-up process of a connection structure may be solved.

According to an aspect of the present disclosure, a semiconductor package may include: a connection structure having first and second surface opposing each other and including a plurality of insulating layers, a plurality of redistribution layers disposed on the plurality of insulating layers, respectively, and a plurality of connection vias penetrating through the plurality of insulating layers and connected to the plurality of redistribution layers, respectively; at least one semiconductor chip disposed on the first surface of the connection structure and having connection pads electrically connected to the plurality of redistribution layers; an encapsulant disposed on the first surface of the connection structure and encapsulating the at least one semiconductor chip; and underbump metallurgy (UBM) layers including UBM pads disposed on the second surface of the connection structure and UBM vias connecting the UBM pads and a redistribution layer adjacent to the second surface of the connection structure among the plurality of redistribution layers to each other. At least one connection via adjacent to the first surface among the plurality of connection vias may have a tapered structure narrowed toward the second surface, and the other connection vias of the plurality of connection vias and the UBM vias may have a tapered structure narrowed toward the first surface.

According to another aspect of the present disclosure, a semiconductor package may include: a connection structure having first and second surface opposing each other and including a plurality of insulating layers, a plurality of redistribution layers disposed on the plurality of insulating layers, respectively, and a plurality of connection vias penetrating through the plurality of insulating layers and connected to the plurality of redistribution layers, respectively; at least one semiconductor chip disposed on the first surface of the connection structure and having connection pads electrically connected to the plurality of redistribution layers; an encapsulant disposed on the first surface of the connection structure and encapsulating the at least one semiconductor chip; UBM layers disposed on the second surface of the connection structure and electrically connected to the plurality of redistribution layers; and a passivation layer disposed on the second surface of the connection structure and embedding at least portions of the UBM layers. The plurality of insulating layers may include the same insulating material, at least one connection via adjacent to the first surface among the plurality of connection vias may have a tapered structure narrowed toward the second surface, and the other connection vias of the plurality of connection vias may have a tapered structure narrowed toward the first surface.

According to another aspect of the present disclosure, a semiconductor package may include: a connection structure including insulating layers, redistribution layers disposed on the insulating layers, respectively, and connection via layers penetrating through the insulating layers and connected to the redistribution layers, respectively; and a semiconductor chip disposed on the connection structure and having connection pads electrically connected to the redistribution layers. A first connection via layer among the connection via layers and a second connection via layer among the connection via layers may be tapered in opposite directions.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Hereinafter, exemplary embodiments in the present disclosure will be described with reference to the accompanying drawings. In the accompanying drawings, shapes, sizes, and the like, of components may be exaggerated or shortened for clarity.

Herein, a lower side, a lower portion, a lower surface, and the like, are used to refer to a downward direction in relation to cross sections of the drawings for convenience, while an upper side, an upper portion, an upper surface, and the like, are used to refer to an opposite direction to the downward direction. However, these directions are defined for convenience of explanation, and the claims are not particularly limited by the directions defined as described above, and concepts of upper and lower portions may be exchanged with each other.

The meaning of a "connection" of a component to another component in the description conceptually includes an indirect connection through an adhesive layer as well as a direct connection between two components. In addition, "electrically connected" conceptually includes a physical connection and a physical disconnection. It can be understood that when an element is referred to with terms such as "first" and "second", the element is not limited thereby. They may be used only for a purpose of distinguishing the element from the other elements, and may not limit the sequence or importance of the elements. In some cases, a first element may be referred to as a second element without departing from the scope of the claims set forth herein. Similarly, a second element may also be referred to as a first element.

The term "an exemplary embodiment" used herein does not refer to the same exemplary embodiment, and is provided to emphasize a particular feature or characteristic different from that of another exemplary embodiment. However, exemplary embodiments provided herein are considered to be able to be implemented by being combined in whole or in part one with one another. For example, one element described in a particular exemplary embodiment, even if it is not described in another exemplary embodiment, may be understood as a description related to another exemplary embodiment, unless an opposite or contradictory description is provided therein.

Terms used herein are used only in order to describe an exemplary embodiment rather than limiting the present disclosure. In this case, singular forms include plural forms unless interpreted otherwise in context.

Electronic Device

Figure 1:
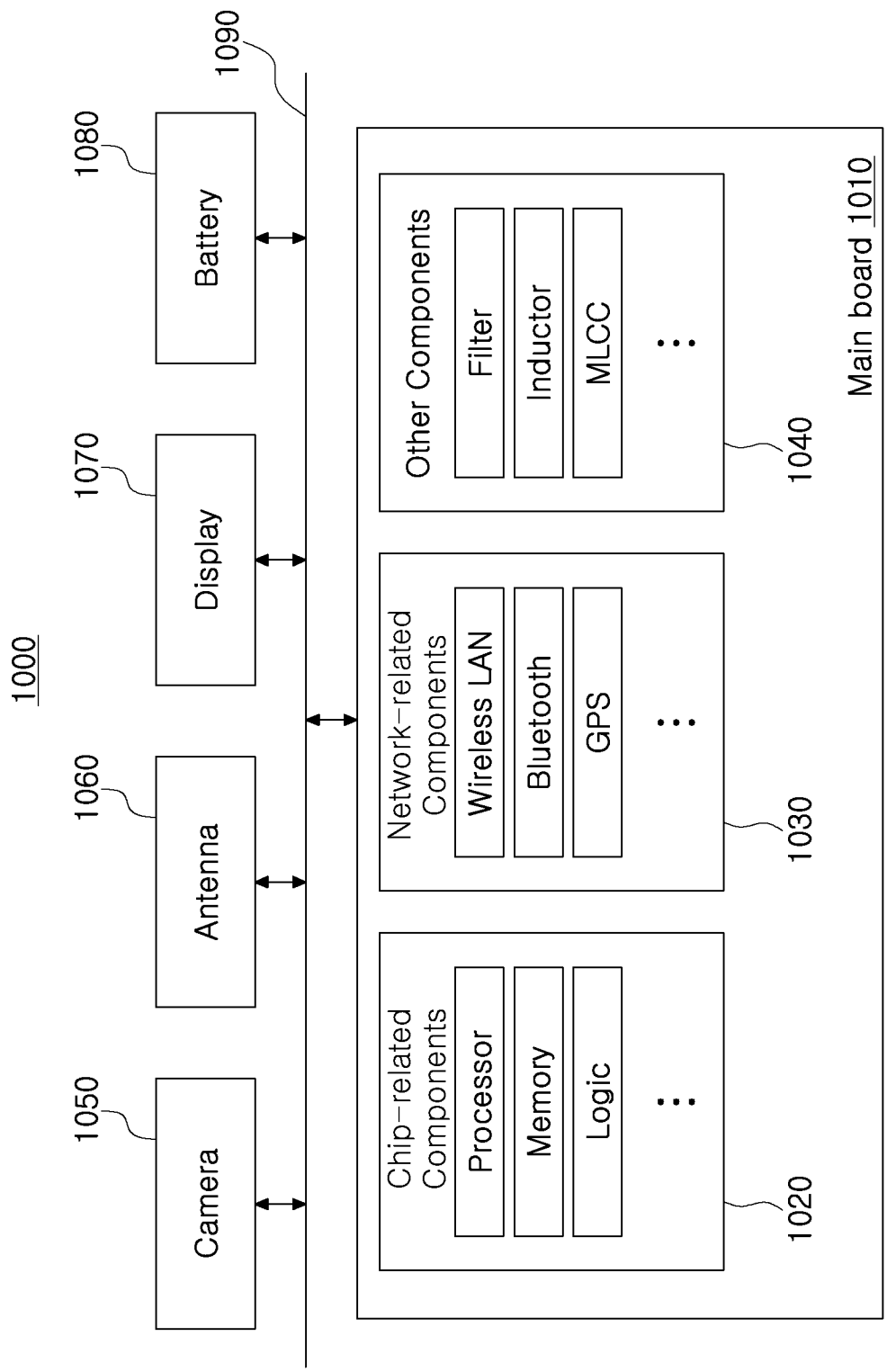
FIG. 1 is a schematic block diagram illustrating an example of an electronic device system.

FIG. 1 is a schematic block diagram illustrating an example of an electronic device system.

Referring to FIG. 1, an electronic device 1000 may accommodate a mainboard 1010 therein. The mainboard 1010 may include chip related components 1020, network related components 1030, other components 1040, and the like, physically or electrically connected thereto. These components may be connected to others to be described below to form various signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital (ADC) converter, an application-specific integrated circuit (ASIC), or the like. However, the chip related components 1020 are not limited thereto, but may also include other types of chip related components. In addition, the chip related components 1020 may be combined with each other.

The network related components 1030 may include protocols such as wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+(HSPA+), high speed downlink packet access+(HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols, designated after the abovementioned protocols. However, the network related components 1030 are not limited thereto, but may also include a variety of other wireless or wired standards or protocols. In addition, the network related components 1030 may be combined with each other, together with the chip related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, but may also include passive components used for various other purposes, or the like. In addition, other components 1040 may be combined with each other, together with the chip related components 1020 or the network related components 1030 described above.

Depending on a type of the electronic device 1000, the electronic device 1000 may include other components that may or may not be physically or electrically connected to the mainboard 1010. These other components may include, for example, a camera 1050, an antenna 1060, a display 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive) (not illustrated), a compact disk (CD) drive (not illustrated), a digital versatile disk (DVD) drive (not illustrated), or the like. However, these other components are not limited thereto, but may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, but may be any other electronic device processing data.

Figure 2:
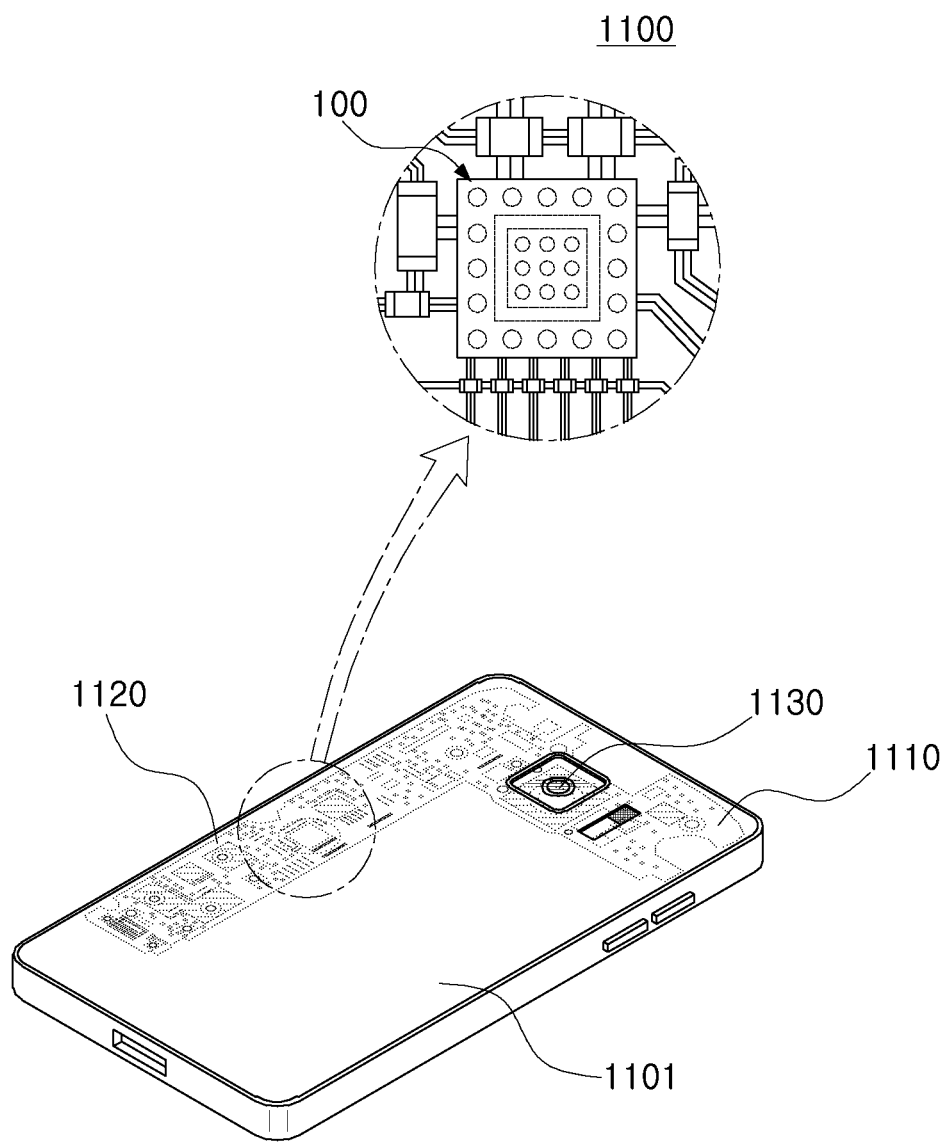
FIG. 2 is a schematic perspective view illustrating an example of an electronic device.

FIG. 2 is a schematic perspective view illustrating an example of an electronic device.

Referring to FIG. 2, a semiconductor device may be used for various purposes in the various electronic devices 1000 as described above. For example, a motherboard 1110 may be accommodated in a body 1101 of a smartphone 1100, and various electronic components 1120 may be physically or electrically connected to the motherboard 1110. In addition, other components that may or may not be physically or electrically connected to the motherboard 1110, such as a camera module 1130, may be accommodated in the body 1101. Some of the electronic components 1120 may be chip related components, and some of the chip related components may be a semiconductor device 1121. Meanwhile, the electronic device is not necessarily limited to the smartphone 1100, but may be other electronic devices.

Semiconductor Device (or Semiconductor Package)

Generally, numerous fine electrical circuits are integrated in a semiconductor chip. However, the semiconductor chip may not serve as a semiconductor finished product in oneself, and may be damaged due to external physical or chemical impact. Therefore, the semiconductor chip is not used in oneself, and is packaged and is used in an electronic device, or the like, in a package state.

The reason why semiconductor packaging is required is that there is a difference in a circuit width between the semiconductor chip and a mainboard of the electronic device in terms of electrical connection. In detail, a size of connection pads of the semiconductor chip and an interval between the connection pads of the semiconductor chip are very fine, but a size of component mounting pads of the mainboard used in the electronic device and an interval between the component mounting pads of the mainboard are significantly larger than those of the semiconductor chip. Therefore, it may be difficult to directly mount the semiconductor chip on the mainboard, and packaging technology for buffering a difference in a circuit width between the semiconductor and the mainboard is required.

A semiconductor device manufactured by the packaging technology described above will hereinafter be described in more detail with reference to the drawings.

Figure 3:
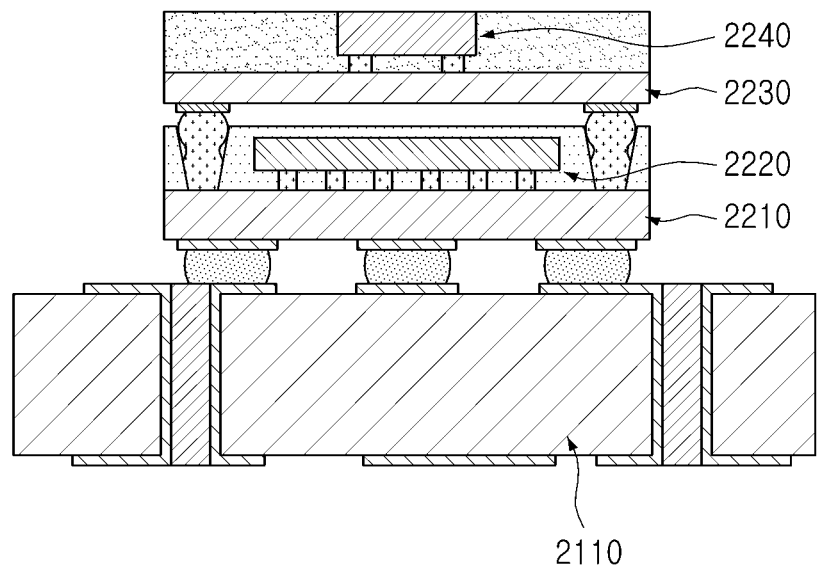
FIG. 3 is a schematic cross-sectional view illustrating a case in which a three-dimensional (3D) ball grid array (BGA) package is mounted on a main board of an electronic device.

FIG. 3 is a schematic cross-sectional view illustrating a case in which a three-dimensional (3D) ball grid array (BGA) package is mounted on a main board of an electronic device.

An application specific integrated circuit (ASIC) such as a graphics processing unit (GPU) among semiconductor chips is very expensive, and it is thus very important to perform packaging on the ASIC at a high yield. For this purpose, a ball grid array (BGA) substrate 2210, or the like, that may redistribute several thousands to several hundreds of thousands of connection pads is prepared before a semiconductor chip is mounted, and the semiconductor chip that is expensive, such as a GPU 2220, or the like, is mounted and packaged on the BGA substrate 2210 by surface mounting technology (SMT), or the like, and is then mounted ultimately on a main board 2110.

Meanwhile, in a case of the GPU 2220, it is required to significantly reduce a signal path between the GPU 2220 and a memory such as a high bandwidth memory (HBM). To this end, a product in which a semiconductor chip such as the HBM 2240 is mounted and then packaged on an interposer 2230, and is then stacked on a package in which the GPU 2220 is mounted, in a package-on-package (POP) form is used. However, in this case, a thickness of a device is excessive increased, and there is a limitation in significantly reducing the signal path.

Figure 4:
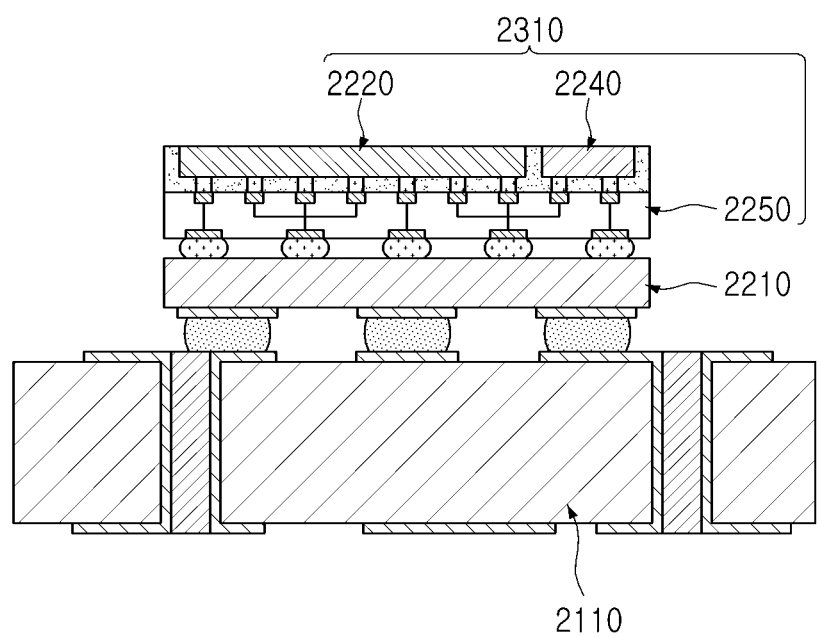
FIG. 4 is a schematic cross-sectional view illustrating a case in which a 2.5D silicon interposer package is mounted on a main board.

FIG. 4 is a schematic cross-sectional view illustrating a case in which a 2.5D silicon interposer package is mounted on a main board.

As a method for solving the problem described above, it may be considered to manufacture a semiconductor device 2310 by 2.5D interposer technology of surface-mounting and then packaging a first semiconductor chip such as a GPU 2220 and a second semiconductor chip such as an HBM 2240 side-by-side with each other on a silicon interposer 2250. In this case, the GPU 2220 and the HBM 2240 having several thousands to several hundreds of thousands of connection pads may be redistributed by the silicon interposer 2250, and may be electrically connected to each other at the shortest path. In addition, when the semiconductor device 2310 is again mounted and redistributed on a BGA substrate 2210, or the like, the semiconductor device 2310 may be ultimately mounted on a main board 2110. However, it is very difficult to form through-silicon vias (TSVs) in the silicon interposer 2250, and a cost required for manufacturing the silicon interposer 2250 is significantly high, and the silicon interposer 2250 is thus disadvantageous in increasing an area and reducing a cost.

Figure 5:
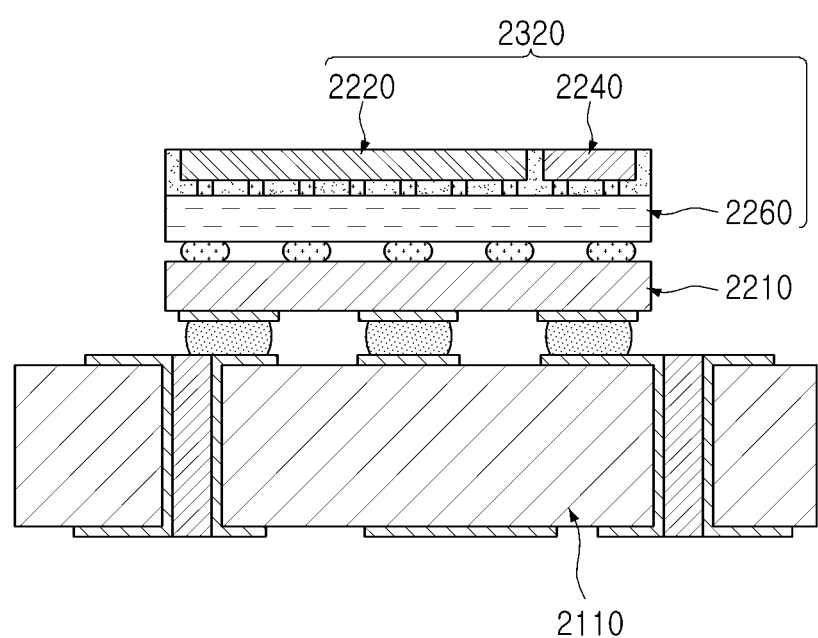
FIG. 5 is a schematic cross-sectional view illustrating a case in which a 2.5D organic interposer package is mounted on a main board.

FIG. 5 is a schematic cross-sectional view illustrating a case in which a 2.5D organic interposer package is mounted on a main board.

As a method for solving the problem described above, it may be considered to use an organic interposer 2260 instead of the silicon interposer 2250. For example, it may be considered to manufacture a semiconductor device 2320 by 2.5D interposer technology of surface-mounting and then packaging a first semiconductor chip such as a GPU 2220 and a second semiconductor chip such as an HBM 2240 side-by-side with each other on the organic interposer 2260. In this case, the GPU 2220 and the HBM 2240 having several thousands to several hundreds of thousands of connection pads may be redistributed by the organic interposer 2260, and may be electrically connected to each other at the shortest path. In addition, when the semiconductor device 2320 is again mounted and redistributed on a BGA substrate 2210, or the like, the semiconductor device 2320 may be ultimately mounted on a main board 2110. In addition, the organic interposer may be advantageous in increasing an area and reducing a cost.

Meanwhile, such a semiconductor device 2320 is manufactured by performing a package process of mounting chips 2220 and 2240 on the organic interposer 2260 and then molding the chips. The reason is that when a molding process is not performed, the semiconductor device is not handled, such that the semiconductor device may not be connected to the BGA substrate 2210, or the like. Therefore, rigidity of the semiconductor device is maintained by the molding. However, when the molding process is performed, warpage of the semiconductor device may occur, fillability of an underfill resin may be deteriorated, and a crack between a die and a molding material of the chips 2220 and 2240 may occur, due to mismatch between coefficients of thermal expansion (CTEs) of the interposer 2260 and the molding material of the chips 2220 and 2240, as described above.

Various exemplary embodiments in the present disclosure will hereinafter be described in detail with reference to the accompanying drawings.

Figure 6:
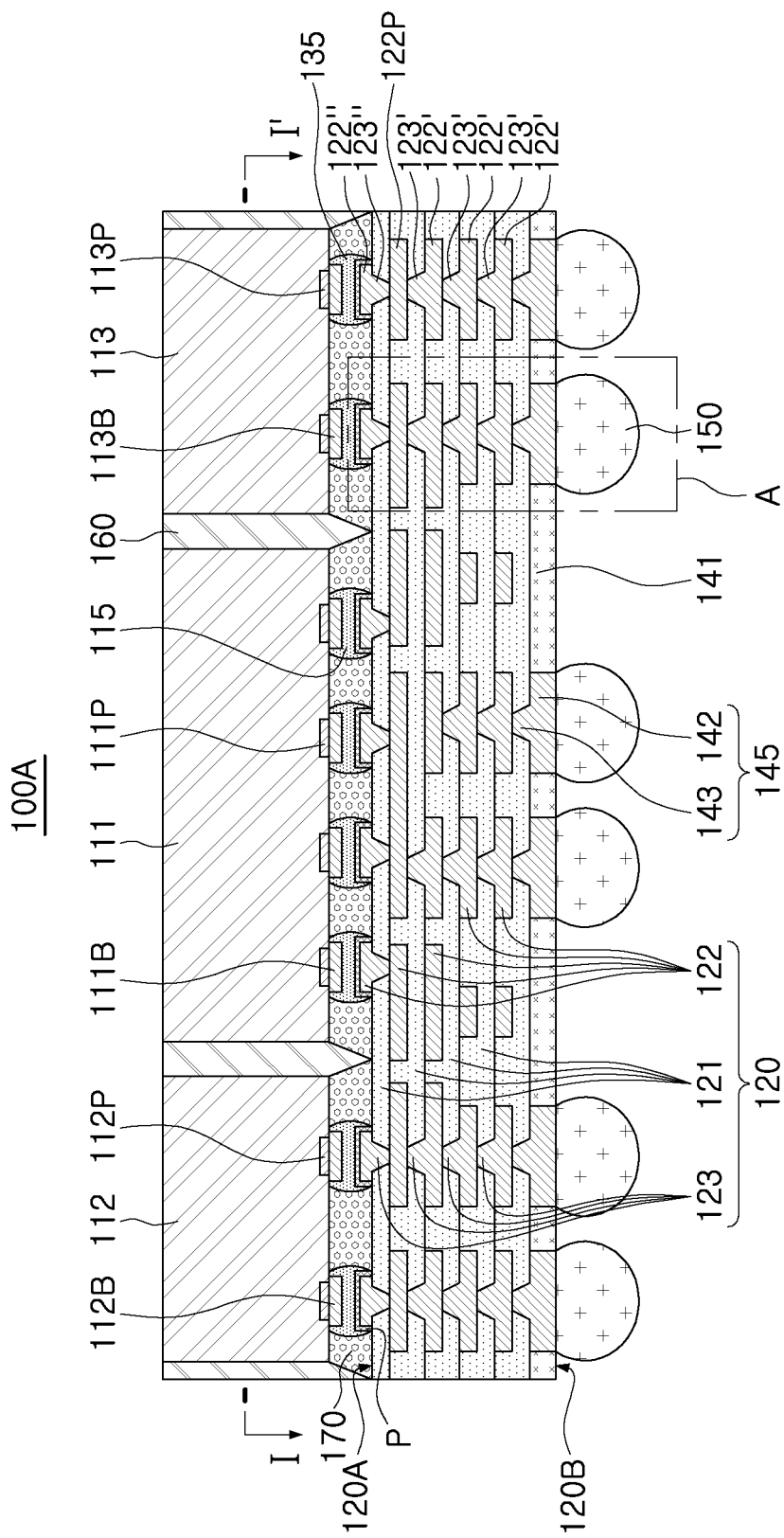
FIG. 6 is a schematic cross-sectional view illustrating a semiconductor package according to an exemplary embodiment in the present disclosure.
Figure 7:
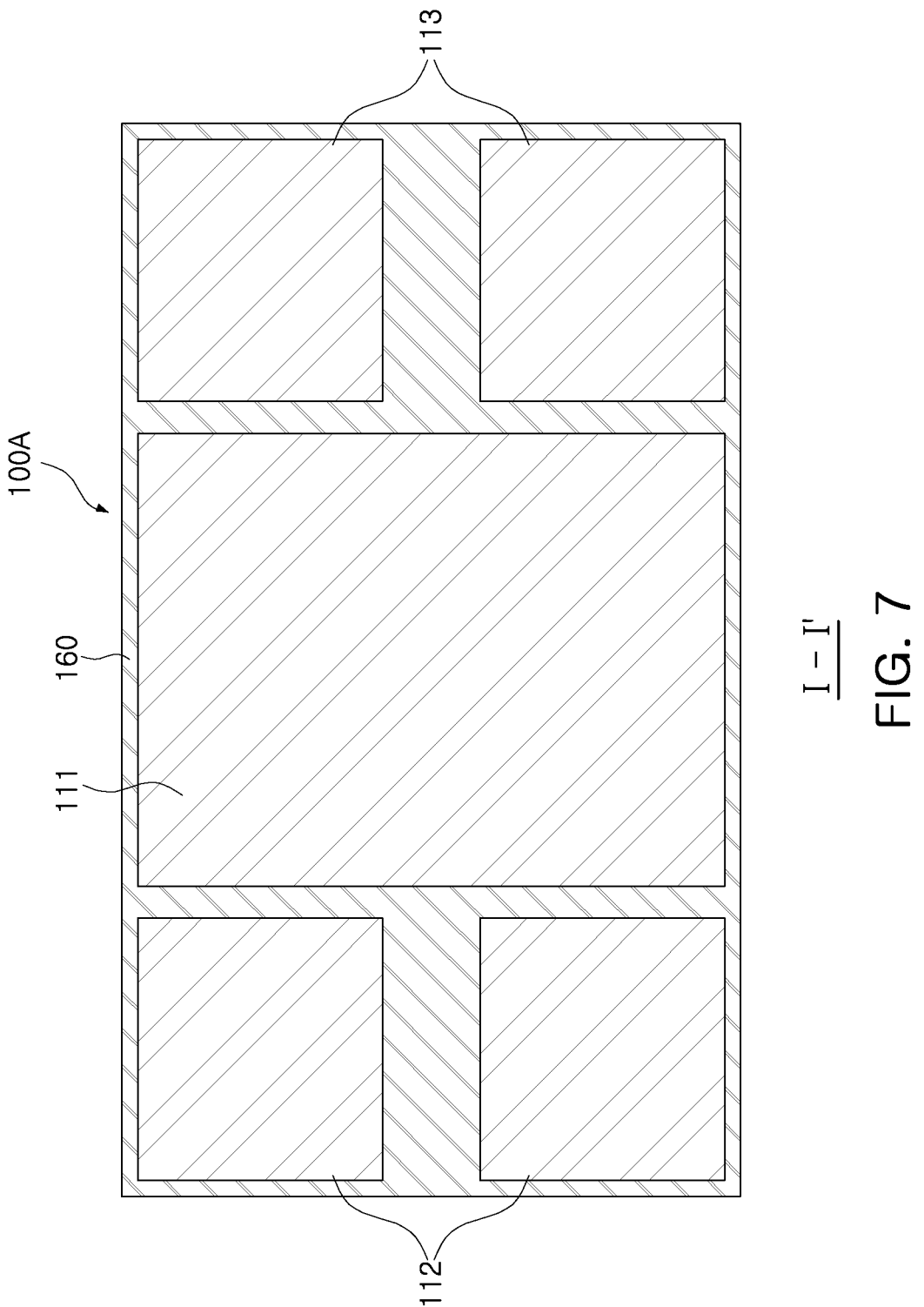
FIG. 7 is a plan view taken along line I-I' of the semiconductor package of FIG. 6.

FIG. 6 is a schematic cross-sectional view illustrating a semiconductor package according to an exemplary embodiment in the present disclosure, and FIG. 7 is a plan view taken along line I-I' of the semiconductor package of FIG. 6.

Referring to FIGS. 6 and 7, a semiconductor package 100A according to the present exemplary embodiment may include a connection structure 120 having a first surface 120A and a second surface 120B opposing each other, first to third semiconductor chips 111, 112, and 113 disposed on the first surface 120A of the connection structure 120, and an encapsulant 160 disposed on the first surface 120A of the connection structure 120 and encapsulating the first to third semiconductor chips 111, 112, and 113.

The connection structure 120 may be used as an interposer packaging the semiconductor chips in order to mount the semiconductor package 100A on a mainboard. The connection structure 120 may include a plurality of insulating layers 121, a plurality of redistribution layers 122 each disposed on the plurality of insulating layers 121, and a plurality of connection vias 123 penetrating through the plurality of insulating layers 121 and each connected to the plurality of redistribution layers 122. A redistribution layer 122" positioned on the first surface of the connection structure among the plurality of redistribution layers 122 may be provided as a connection wiring layer connected to each of connection pads 111P, 112P, and 113P of the first to third semiconductor chips 111, 112, and 113. A thickness of the redistribution layer 122" may be greater than that of each of the other redistribution layers 122.

The connection pads 111P, 112P, and 113P of the first to third semiconductor chips 111, 112, and 113 may be electrically connected to the connection redistribution layer 122" of the plurality of redistribution layers 122 using connection members 135, respectively. Each of the connection members 135 may be formed of a low melting point metal such as tin (Sn) or alloys including tin (Sn).

In addition, the semiconductor package 100A may include an underfill resin 170 disposed between surfaces (hereinafter, referred to as active surfaces) of the first to third semiconductor chips 111, 112, and 113 on which the connection pads 111p, 112p, and 113p are formed and the first surface 120A of the connection structure 120. The underfill resin 170 may stably fix the first to third semiconductor chips 111, 112, and 113 onto the connection structure 120. For example, the underfill resin 170 may be a thermosetting resin such as epoxy, or the like.

The encapsulant 160 may be formed so that upper surfaces of the first to third semiconductor chips 111, 112, and 113 are exposed through an upper surface of the encapsulant 160. Heat may be easily dissipated through the exposed upper surfaces. The upper surfaces of the semiconductor chips 111, 112, and 113 and the upper surface of the encapsulant 160 may be substantially coplanar with each other by a polishing process. The semiconductor package 100A is not limited thereto, and may be modified to have various forms in which a heat dissipation plate (see FIG. 11) or another reinforcing member surrounding the semiconductor chips is additionally introduced.

Underbump metallurgy (UBM) layers 145 may include UBM pads 142 disposed on the second surface 120B of the connection structure 120 and UBM vias 143 connecting a redistribution layer 122' adjacent to the second surface 120B of the connection structure 120 among the plurality of redistribution layers 122 and the UBM pads 142 to each other.

Figure 8:
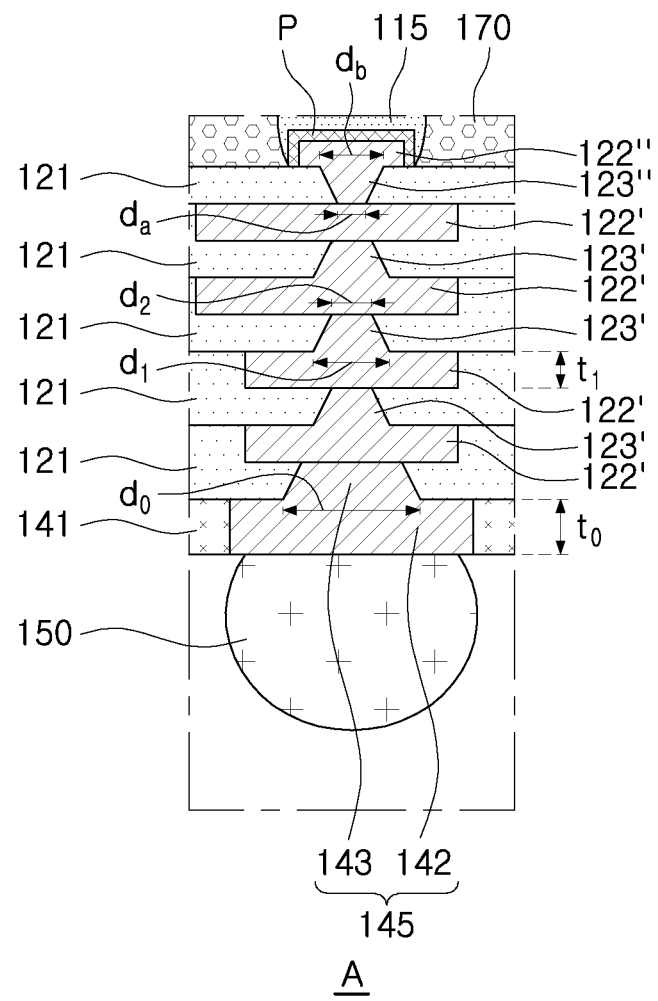
FIG. 8 is an enlarged cross-sectional view of portion "A" of the semiconductor package of FIG. 6.

FIG. 8 is an enlarged cross-sectional view of portion "A" of the semiconductor package of FIG. 6.

Referring to FIGS. 6 and 8, the plurality of connection vias 123 used in the present exemplary embodiment may have different formation directions in relation to one intermediate redistribution layer 122P (hereinafter, referred to as an "intermediate redistribution layer 122P"). In detail, connection vias 123" adjacent to the first surface 120A among the plurality of connection vias 123 may have a tapered structure in which they become narrow toward the second surface 120B, while the other connection vias 123' of the plurality of connection vias 123 may have a tapered structure in which they become narrow toward the first surface 120A. In other words, the connection vias 123" adjacent to the first surface 120A may be represented as having a lower diameter (or a lower width) $d_a$ smaller than an upper diameter (or an upper width) $d_b$, while the other connection vias 123' may be represented as having a lower diameter (or a lower width) $d_1$ greater than an upper diameter (or an upper width) dz.

In addition, the UBM vias 143 may also have a tapered structure in which they become narrow toward the first surface 120A, similar to the other connection vias 123'.

The connection vias 123" that become narrow toward the second surface 120B may be the uppermost connection vias connected to a connection redistribution layer 122", and a case in which connection vias 123" of only one layer are tapered in the same direction is exemplified, but connection vias of two or more layers adjacent to the first surface 120A may have a tapered structure so that they become narrow toward the second surface 120B. However, in order to sufficiently alleviate undulation, the connection vias 123" tapered to become toward the second surface 120B may be designed to have layers that are the same as or less than those of the other connection vias 123'.

The different formation directions of the connection vias 123' and 123" may be implemented by introducing a transfer process using an additional carrier substrate in a build-up process of the redistribution layers 122 (see FIGS. 9A through 9F). In a build-up process of a primary redistribution layer performed before a resultant is transferred to the additional carrier substrate, the UBM pad 142 may be disposed on the uppermost level, and an undulation problem may thus be significantly alleviated as compared to a case in which the UBM pad 142 is positioned on a level below a build-up structure. In addition, since each of the plurality of insulating layers 121 includes an organic material, an the undulation problem may occur when the UBM pad 142 is positioned on a level below the redistribution layer 122 in the build-up process, and as illustrated in FIG. 8, a thickness $t_0$ of the UBM pad 142 may be greater than a thickness ti of the redistribution layer 122. Therefore, such a problem may more seriously occur. However, a structure according to the present exemplary embodiment may be understood as a resultant of a process (that is, a process of forming the UBM pad 142 on the uppermost level in an initial build-up process) of significantly alleviating such an undulation problem.

In the present exemplary embodiment, a diameter (or a width) $d_0$ of a lower portion of the UBM via 143 may be greater than a diameter (or a width) $d_1$ of each lower portion of the plurality of connection vias 123. However, the diameter (or the width) $d_0$ of the lower portion of the UBM via 143 is not limited thereto. In some exemplary embodiment, even though the diameter (or the width) $d_0$ of the lower portion of the UBM via 143 is not greater than the diameter (or the width) $d_1$ of each lower portion of the plurality of connection vias 122, and is the same or smaller than the diameter (or the width) $d_1$ of each lower portion of the plurality of connection vias 122, a plurality of UBM vias associated with one UBM pad may be formed.

The UBM pad 142 used in the present exemplary embodiment may have an integrated structure with the UBM via 143. The redistribution layer 122″ positioned on the first surface 120A of the connection structure 120 may have an integrated structure with a connection via 123″ adjacent thereto.

In the present specification, a term "integrated structure" does not mean that two components are simply in contact with each other, and refers to a structure in which two components are formed integrally with each other using the same material by the same process. For example, when a pattern (a redistribution layer or a pad) and a via are formed together by the same plating process, the via and the pattern may be called the integrated structure.

The semiconductor package 100A according to the present exemplary embodiment may include a passivation layer 141 disposed on the second surface 120B of the connection structure 120 and embedding at least portions of the UBM pads 142.

The passivation layer 141 may surround side surfaces of the UBM pads 142 so that one surfaces of the UBM pads 142 are exposed. In another exemplary embodiment, the passivation layer 141 may be formed so that side surfaces of the UBM pad 142 adjacent to the exposed one surfaces of the UBM pads 142 are also partially exposed (see FIG. 11). The passivation layer 141 may protect the connection structure 120 from external physical or chemical damage.

The respective components included in the semiconductor package 100A according to the present exemplary embodiment will hereinafter be described in more detail.

The connection structure 120 may redistribute the respective connection pads 111P, 112P, and 113P of the first to third semiconductor chips 111, 112, and 113. Several thousands to several hundreds of thousands of connection pads 111P, 112P, and 113P of the first to third semiconductor chips 111, 112, and 113 having various functions may be redistributed by the connection structure 120, and may be physically or electrically externally connected through electrical connection metals 150 depending on functions. In addition, the respective connection pads 111P, 112P, and 113P of the first to third semiconductor chips 111, 112, and 113 may be electrically connected to each other at the shortest path through the connection structure 120. The connection structure 120 may include the plurality of insulating layers 121, the redistribution layers 122 formed on or in the plurality of insulating layers 121, and the connection vias 123 penetrating through the insulating layers 121 and electrically connecting the redistribution layers 122 formed on different layers to each other. The number of layers of the connection structure 120 may be more than that illustrated in the drawings or be less than that illustrated in the drawings. The connection structure 120 having such a form may be used as a 2.5D type organic interposer.

The plurality of insulating layers 121 may serve as dielectric layers of the connection structure 120, and a material of each of the insulating layers 121 may be a thermosetting resin such as an epoxy resin, a thermoplastic resin such as a polyimide resin, a resin in which the thermosetting resin or the thermoplastic resin is mixed with an inorganic filler, for example, an organic insulating material such as Ajinomoto Build-up Film (ABF). In some exemplary embodiments, a resin in which a thermosetting resin or a thermoplastic resin is impregnated together with an inorganic filler in a core material such as a glass fiber (or a glass cloth or a glass fabric), for example, prepreg, or the like, may also be used as the material of each of the insulating layers 121.

In some exemplary embodiments, a photosensitive insulating material such as a photoimagable dielectric (PID) resin may be used as the material of each of the insulating layers 121. Since the plurality of insulating layers 121 may be integrated with each other depending on a process as in the present exemplary embodiment, a boundary between the insulating layers 121 may be not apparent. Since the plurality of insulating layers 121 each include the organic material, the plurality of insulating layers 121 may be exposed to an undulation problem. The plurality of insulating layers 121 used in the present exemplary embodiment may be formed using the same insulating material.

A material of the passivation layer 141 is not particularly limited, and may be, for example, the insulating material of the plurality of insulating layers 121 described above. In some exemplary embodiments, the material of the passivation layer 141 may be different from that of the plurality of insulating layers 121. For example, the passivation layer 141 may include an ABF, and the plurality of insulating layers 121 may be formed of a PID.

The plurality of redistribution layers 122 may redistribute the connection pads 111P, 112P, and 113P, and serve to connect the connection pads 111P, 112P, and 113P to each other depending on a signal, power, or the like. Each of the redistribution layers 122 may include, for example, a conductive material such as copper (Cu), aluminum (Al), silver (Ag), tin (Sn), gold (Au), nickel (Ni), lead (Pb), titanium (Ti), or alloys thereof. The redistribution layers 122 may perform various functions depending on designs of corresponding layers. For example, the redistribution layers 122 may include ground (GND) patterns, power (PWR) patterns, signal (S) patterns, and the like. Here, the signal (S) patterns may include various signals except for the ground (GND) patterns, the power (PWR) patterns, and the like, such as data signals, and the like. In addition, the redistribution layers 122 may include via pads, electrical connection metal pads, and the like. A surface treatment layer P may be formed on surfaces of patterns of the redistribution layer 122 serving as pads for mounting the first to third semiconductor chips 111, 112, and 113. The surface treatment layer P is not particularly limited as long as it is known in the related art, and may be formed by, for example, electrolytic gold plating, electroless gold plating, organic solderability preservative (OSP) or electroless tin plating, electroless silver plating, electroless nickel plating/substituted gold plating, direct immersion gold (DIG) plating, hot air solder leveling (HASL), or the like, but is not limited thereto.

The plurality of connection vias 123 may electrically connect the redistribution layers 122 formed on different layers to each other, resulting in an electrical path in the connection structure 120. Each of the connection vias 123 may include, for example, a conductive material such as copper (Cu), aluminum (Al), silver (Ag), tin (Sn), gold (Au), nickel (Ni), lead (Pb), titanium (Ti), or alloys thereof. The connection vias 123 may be completely filled with a conductive material, but are not limited thereto. The plurality of connection vias 123 may have structures tapered in different directions, as described above, and a cross-sectional shape of each of the plurality of connection vias 123 may be understood to be a substantially trapezoidal or inverse trapezoidal shape in FIGS. 6 and 8.

Each of the first to third semiconductor chips 111, 112, and 113 may be an integrated circuit (IC) provided in an amount of several hundreds to several millions of elements or more integrated in a single chip. In this case, a base material of a body of each of the first to third semiconductor chips may be silicon (Si), germanium (Ge), gallium arsenide (GaAs), or the like. Various circuits may be formed on each of the bodies. For example, each of the connection pads 111P, 112P, and 113P may be formed of a conductive material such as aluminum (Al), or the like. Passivation layers exposing the connection pads 111P, 112P, and 113P may be formed on the respective bodies, and may be oxide layers, nitride layers, or the like, or double layers of an oxide layer and a nitride layer. An insulating layer, and the like, may further be disposed in required positions. In some exemplary embodiments, the semiconductor package may further include a redistribution layer (not illustrated) formed at a wafer level on active surfaces of the first to third semiconductor chips 111, 112, and 113. In addition, the first to third semiconductor chips 111, 112, and 113 may have bumps 111B, 112B, and 113B each connected to the connection pads 111P, 112P, and 113P, respectively. Each of the bumps 111B, 112B, and 113B may be formed of a metal or a solder. The first to third semiconductor chips 111, 112, and 113 may be connected to an exposed upper redistribution layer 122" of the connection structure 120 through the connection pads 111P, 112P, and 113P and/or the bumps 111B, 112B, and 113B, and connection members 135 such as solders, or the like. Each of the first to third semiconductor chips 111, 112, and 113 may be fixed to the connection structure 120 by the underfill resin 170, as described above.

In some exemplary embodiment, the first semiconductor chip 111 may be an ASIC such as a GPU. A plurality of second and third semiconductor chips 112 and 113 (a case in which the numbers of each of second and third semiconductor chips 112 and 113 is two is exemplified) may be memories such as HBMs. That is, each of the first to third semiconductor chips 111, 112, and 113 may be an expensive chip having several hundreds of thousands or more of inputs/outputs (I/Os), but is not limited thereto. For example, the two second semiconductor chips 112, the HBMs may be disposed side-by-side with each other at one side of the first semiconductor chip 111, the ASIC such as the GPU, or the like, and the two third semiconductor chips 113, the HBMs may be disposed side-by-side with each other at the other side of the first semiconductor chip 111, the ASIC such as the GPU, or the like. A combination of the semiconductor chips that may be used in the present exemplary embodiment is not limited thereto, and may include at least one selected among various logic elements and various memory elements, and the number of the semiconductor chips may be appropriately selected.

The underbump metallurgy (UBM) layers 145 may improve connection reliability of the electrical connection metals 150, resulting in improvement of reliability of the semiconductor package 100A. The UBM layers 145 may be formed in the openings of the passivation layer 141, and may be electrically connected to the redistribution layer 122 of the connection structure 120. The UBM layers 145 may be formed by any known metallization method. For example, each of the UBM layers 145 may include a metal such as copper (Cu).

The electrical connection metals 150 may physically or electrically externally connect the semiconductor package 100A. For example, the semiconductor package 100A may be mounted on the BGA substrate through the electrical connection metals 150. Each of the electrical connection metals 150 may be formed of a conductive material and a low melting point metal such as tin (Sn) or alloys including tin (Sn). In more detail, each of the electrical connection metals 150 may be formed of a solder, or the like. Each of the electrical connection metals 150 may be a land, a ball, a pin, or the like. The electrical connection metals 150 may be formed as a multilayer or single layer structure. When the electrical connection metals 150 are formed as a multilayer structure, the electrical connection metals 150 may include a copper (Cu) pillar and a solder. When the electrical connection metals 150 are formed as a single layer structure, the electrical connection metals 150 may include a tin-silver solder or copper (Cu). However, this is only an example, and the electrical connection metals 150 are not limited thereto. The number, an interval, a disposition form, and the like, of electrical connection metals 150 are not particularly limited, but may be sufficiently modified depending on design particulars by those skilled in the art. For example, the electrical connection metals 150 may be provided in an amount of several thousands to several hundreds of thousands according to the number of connection pads 111P, 112P, and 113P, or may be provided in an amount of several thousands to several hundreds of thousands or more or several thousands to several hundreds of thousands or less.

An example of a method of manufacturing a semiconductor package according to the present exemplary embodiment will hereinafter be described in detail. A method of manufacturing the semiconductor package 100A illustrated in FIG. 6 will be divided into and described as processes (FIGS. 9A through 9F) of forming the connection structure and processes (FIGS. 10A through 10C) of manufacturing the semiconductor package.

FIGS. 9A through 9F are cross-sectional views for describing main processes of forming the connection structure in a method of manufacturing the semiconductor package according to an exemplary embodiment in the present disclosure.

Figure 9A:
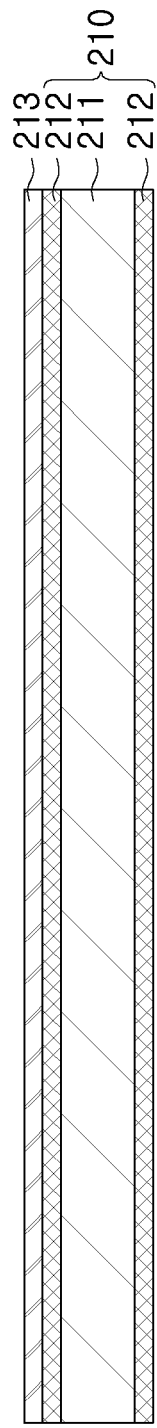
FIGS. 9A through 9F are cross-sectional views for describing main processes of manufacturing a connection structure in a method of manufacturing the semiconductor package illustrated in FIG. 6.

Referring to FIG. 9A, a first carrier substrate 210 for forming the connection structure may be prepared.

The first carrier substrate 210 may include a core layer 211 and metal layers 212 respectively formed on opposite surfaces of the core layer. The core layer 211 may be formed of an insulating resin or an insulating resin (for example, prepreg) including an inorganic filler and/or a glass fiber, and the metal layers 212 may be metal layers formed of copper (Cu). The first carrier substrate 210 may include a release layer 213 formed on one surface thereof. Such a structure of the first carrier substrate and the use of the release layer may be variously modified.

Figure 9B:
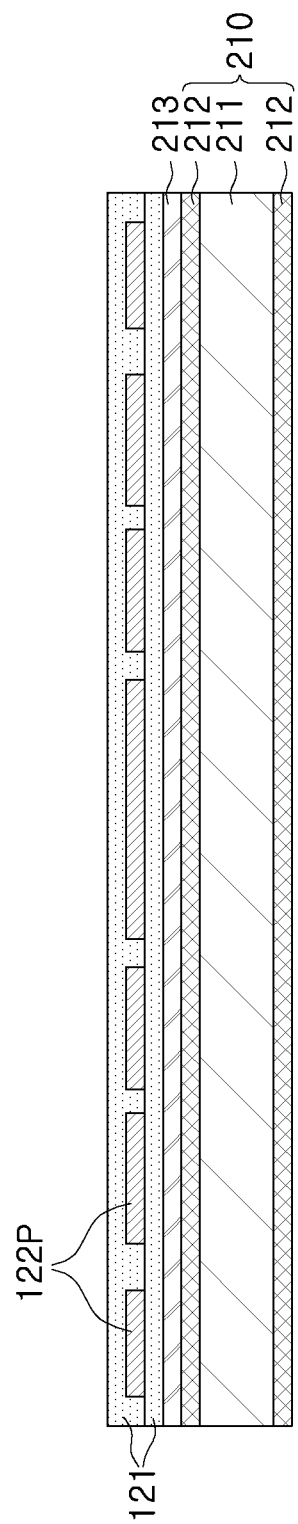

Then, referring to FIG. 9B, an insulating layer 121 and an intermediate redistribution layer 122P may be formed on the first carrier substrate 210.

The intermediate redistribution layer 122P may be provided as a pattern without including connection vias integrated therewith. In the present process, one insulating layer 121 may be formed on the release layer 213, the intermediate redistribution layer 122P may be formed on the one insulating layer 121 without including the connection vias, and another insulating layer 121 may then be formed to cover the intermediate redistribution layer 122P. The intermediate redistribution layer 122P formed in the present process may be one of the plurality of redistribution layers 122, and connection vias 123' disposed above and below the intermediate redistribution layer 122P may have different formation directions. The insulating layer 121 may be formed by laminating a film form or applying and hardening a liquid phase form.

Figure 9C:
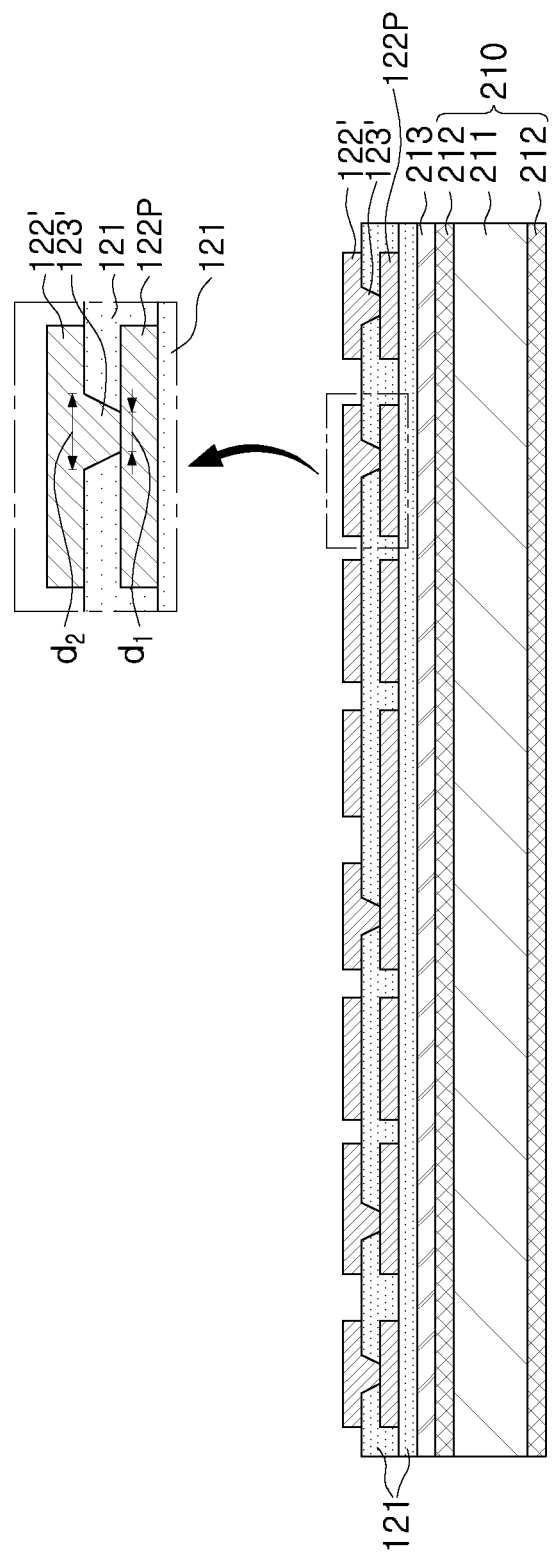

Then, referring to FIG. 9C, the redistribution layer 122' and the connection vias 123' connected to the intermediate redistribution layer 122P may be formed.

In the present process, the redistribution layer 122' may be formed together with the connection vias 123' by forming holes connected to the intermediate redistribution layer 122P in the insulating layer 121, forming a dry film having a desired pattern, and performing a plating process using the dry film. When the insulating layer 121 is formed of a PID, the holes of the insulating layer 121 may be formed by a photolithography process, and a hole array of a fine pitch may be implemented.

Figure 9D:
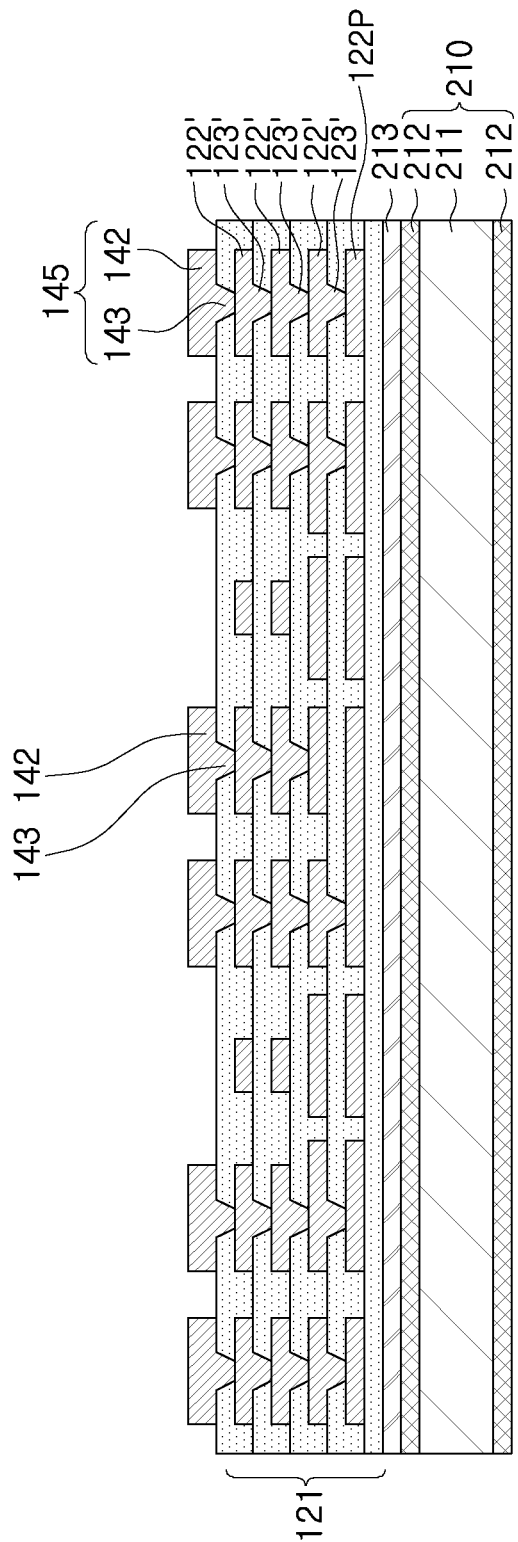

Then, referring to FIG. 9D, a process of forming the insulating layer 121 and a process of forming the connection vias 123' and the redistribution layer 122' may be repeatedly performed, and the UBM layers 145 may be formed on an insulating layer 121 positioned at an upper portion of the connection structure.

Similar to the process described with reference to FIG. 9C, the process of forming the insulating layer 121 and the process of forming the connection vias 123' and the redistribution layer 122' may be repeatedly performed as many times as necessary. The UBM pads 142 and the UBM vias 143 connected to a redistribution layer 122' adjacent thereto may be formed on and in the insulating layer 121 positioned at the upper portion of the connection structure to form desired UBM layers 145.

A process of forming the UBM layers 145 may be performed continuously in the same line as that of the process of forming the connection vias 123' and the redistribution layer 122'. The connection vias 123' and the redistribution layer 122', and the UBM vias 143 and the UBM pads 142 formed by the same plating process may be formed to have integrated structures, respectively.

Meanwhile, the UBM pad 142 may have a thickness greater than that of the redistribution layer 122', as described above. For example, the thickness of the UBM pad 142 may be three times or more the thickness of the redistribution layer 122'. In a case in which the UBM pads 142 that are relatively thick are introduced and positioned at a lower portion of the connection structure before a process of forming a series of redistribution layers 122' as illustrated in FIGS. 9C and 9D, as the number of layers is increased, an undulation problem may severely occur. However, the UBM pads 142 may be disposed on the uppermost level in an overall build-up process as illustrated in FIG. 9D, and thus, the undulation problem may be significantly reduced.

Figure 9E:
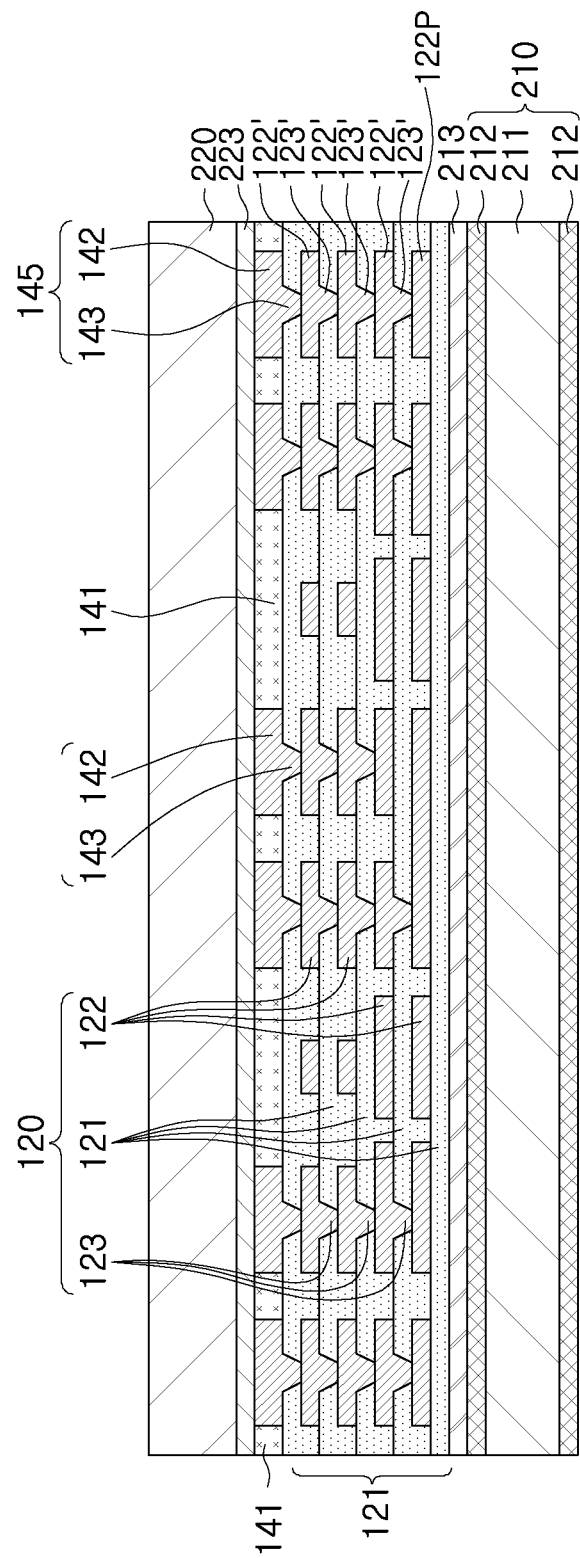

Then, referring to FIG. 9E, the passivation layer 141 may be formed in the vicinity of the UBM pads 142, and a second carrier substrate 220 may be attached to the passivation layer 141.

In a case in which the passivation layer 141 is formed to cover the UBM pads 142, a Descum or etching process may be applied in the subsequent process to expose the UBM pads 142. However, in the present process, the passivation layer 141 may be formed to surround side surfaces of the UBM pads 142 while have one surfaces of the UBM pads 142 exposed from the passivation layer 141. In this case, a Descum or etching process using plasma, or the like, for exposing the UBM pads 142 may be omitted in the subsequent process, but the present process is not limited thereto. The second carrier substrate 220 may include a release layer 223 formed on a bonded surface, similar to the first carrier substrate 210, but is not limited thereto.

Figure 9F:
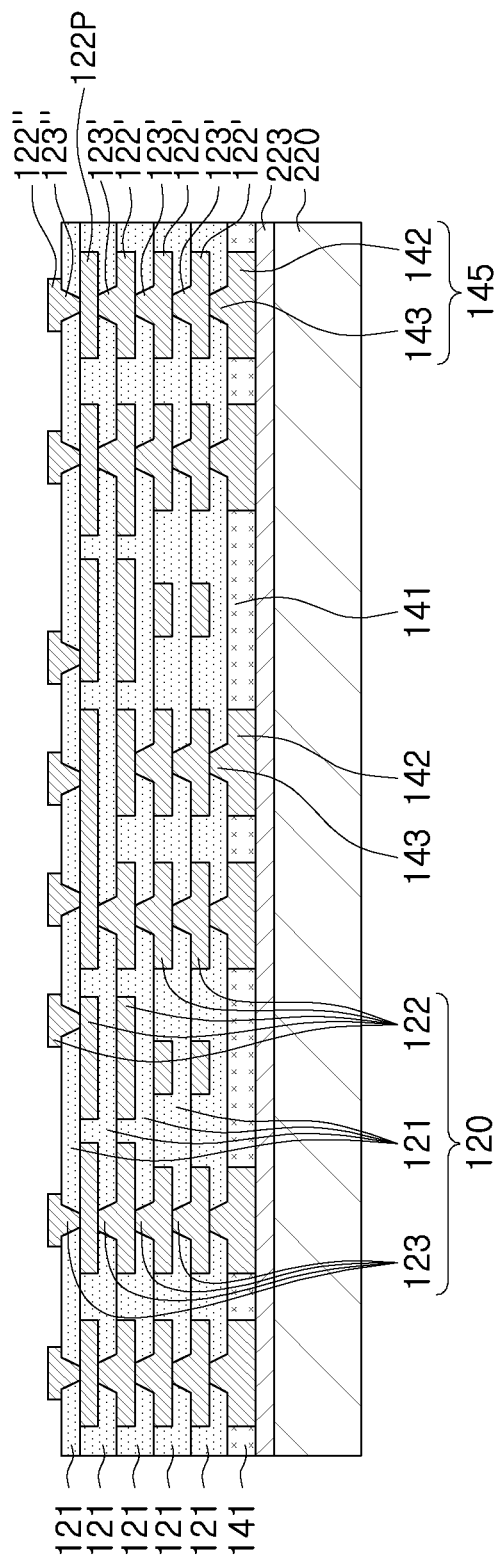

Then, referring to FIG. 9F, the first carrier substrate 210 may be removed, and additional connection vias 123" and redistribution layer 122" may then be formed on an exposed insulating layer 121.

Since the connection vias 123" connected to the redistribution layer 122" formed in the present process are formed after a resultant is transferred to the second carrier substrate 220, a formation direction of the connection vias 123" may be opposite to that of the connection vias 123' connected to the redistribution layer 122' formed before the transfer process. The connection vias 123" formed in the present process may have a tapered structure in which they become narrow toward the second carrier substrate 220 (or the intermediate redistribution layer 122P), while the other connection vias 123' formed before the present process may have a tapered structure in which they become narrow toward the intermediate redistribution layer 122P.

In the present exemplary embodiment, after the resultant is transferred to the second carrier substrate 220, the redistribution layer 122" formed on an exposed surface of the insulating layer 121 may be a connection redistribution layer that is to be connected to the connection pads of the semiconductor chip. Here, a form in which one redistribution layer 122" is formed after the transfer process is exemplified, but in some exemplary embodiments, two or more redistribution layers and connection vias may be formed in the present process.

Figure 10A:
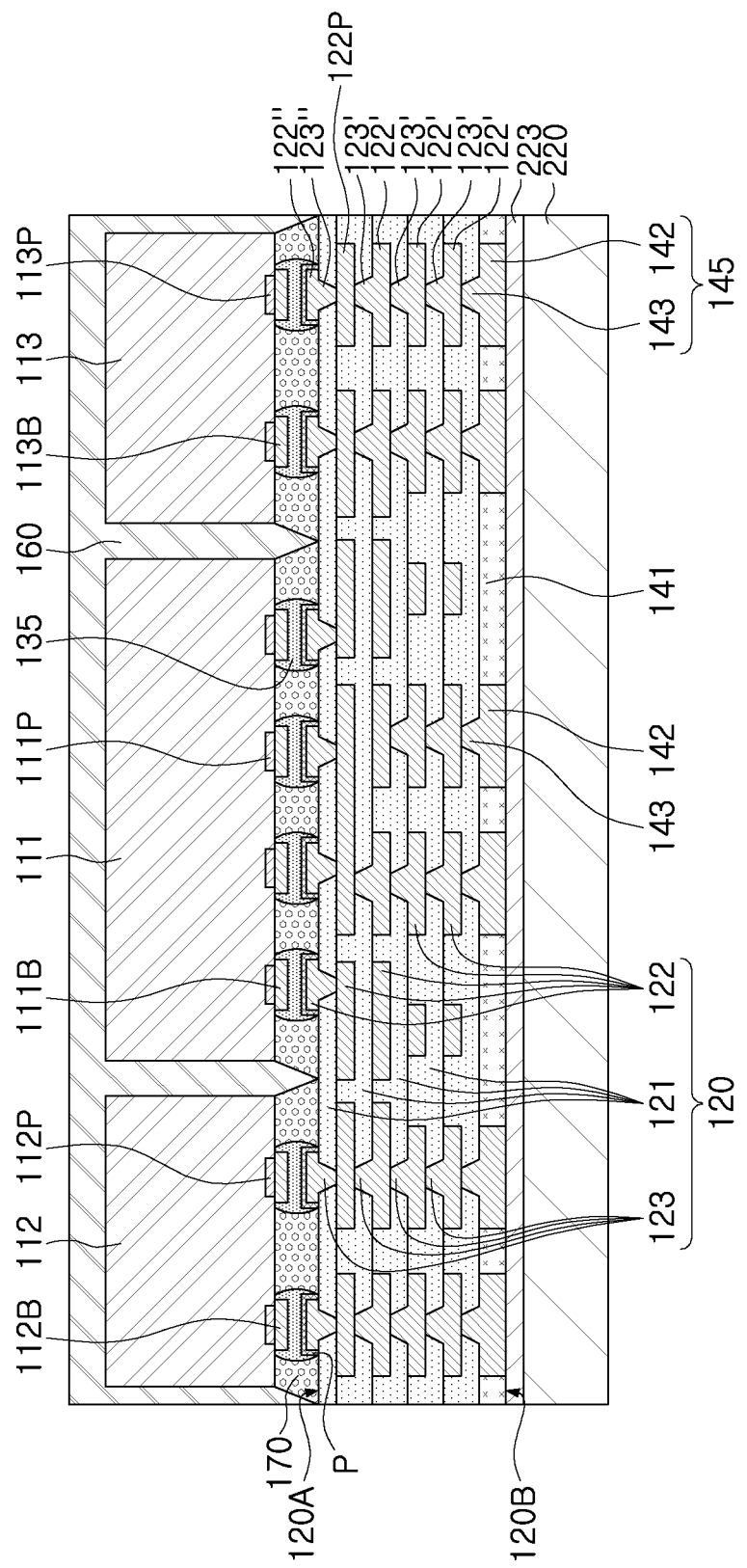
FIGS. 10A through 10C are cross-sectional views for describing main processes of mounting a semiconductor chip in the method of manufacturing the semiconductor package illustrated in FIG. 6.
Figure 10B:
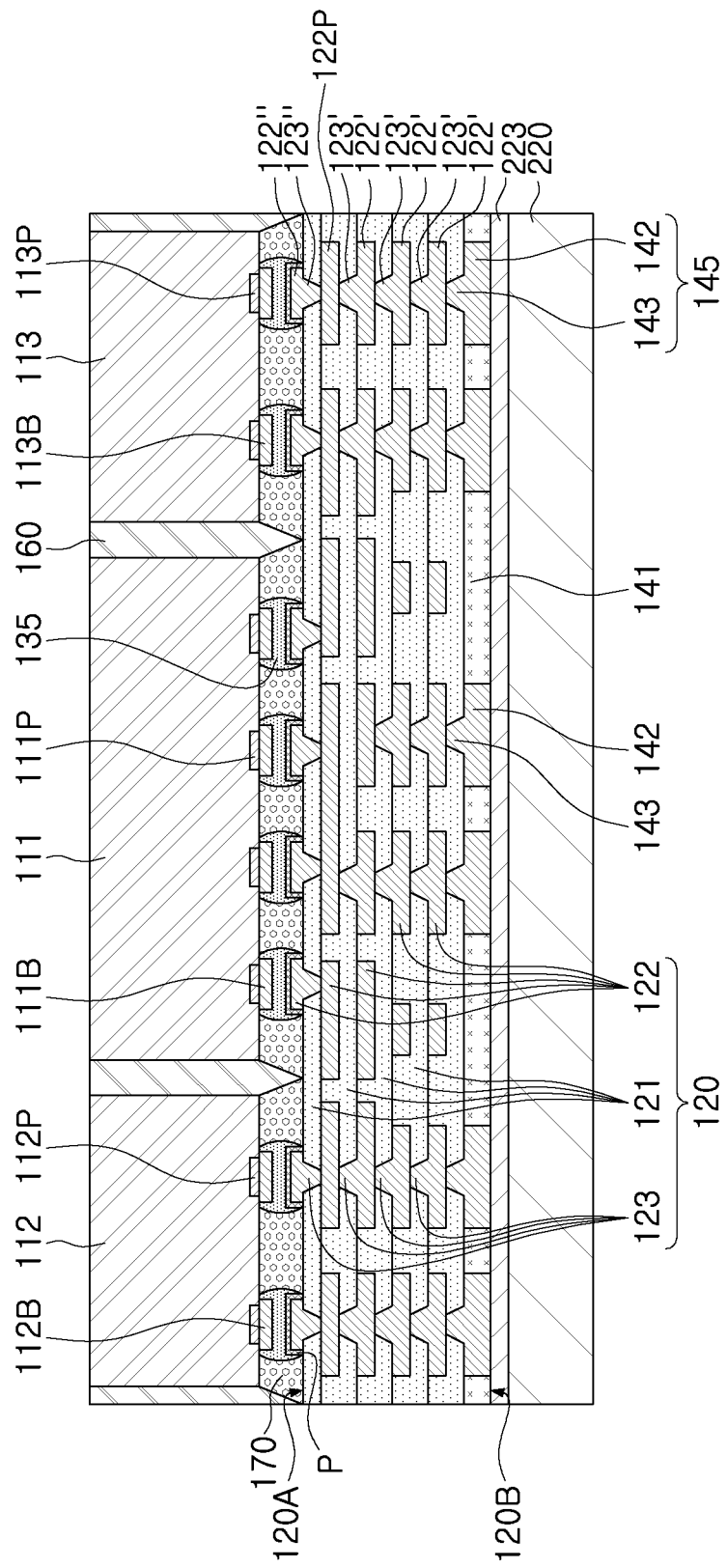
Figure 10C:
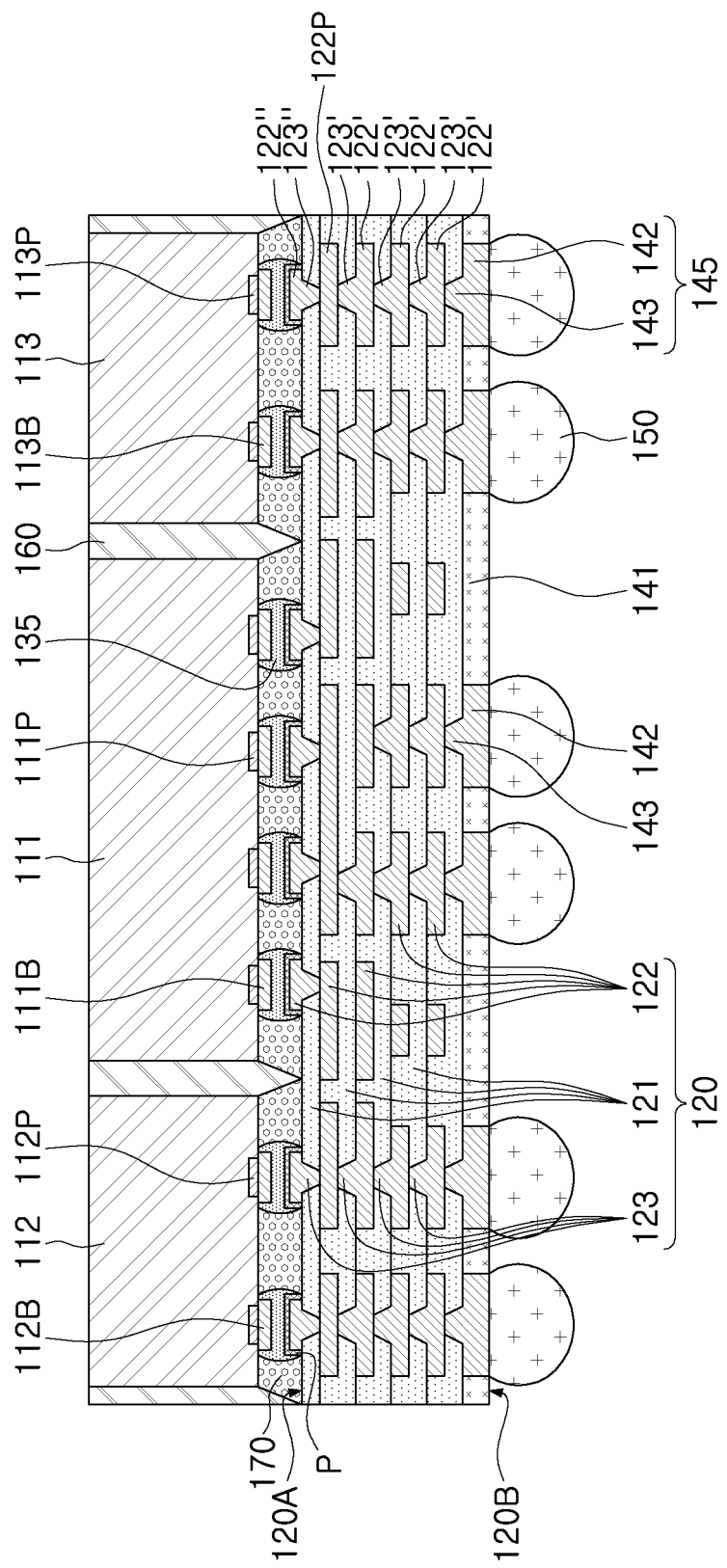

FIGS. 10A through 10C illustrate processes of manufacturing the semiconductor package using the connection structure illustrated in FIG. 9F as portions of the method of manufacturing the semiconductor package according to an exemplary embodiment in the present disclosure.

Referring to FIG. 10A, the first to third semiconductor chips 111, 112, and 113 may be mounted on the connection structure 120.

The present mounting process may be performed using connection members 135, such as solders, or the like. Additionally, the semiconductor chips 111, 112, and 113 may be more stably fixed by the underfill resin 170. Then, the encapsulant 160 encapsulating the semiconductor chips 111, 112, and 113 may be formed on the connection structure 120. The encapsulant 160 may be formed by laminating a film form or applying and hardening a liquid phase form.

Then, referring to FIG. 10B, the encapsulant 160 may be grinded so that surfaces of the first to third semiconductor chips 111, 112, and 113 are exposed.

Upper surfaces of the first to third semiconductor chips 111, 112, and 113 may be disposed on the same level by the present grinding process, and may be substantially coplanar with an upper surface of the encapsulant. Since portions of the semiconductor chips partially removed in the grinding process are inactive regions, they may not be related to functions, and the semiconductor chips are exposed externally of the encapsulant, and a heat dissipation effect may thus be improved.

Then, referring to FIG. 10C, the second carrier substrate 220 may be removed from the connection structure 120, and the electrical connection metals 150 may be formed on the exposed UBM layers 145.

Figure 11:
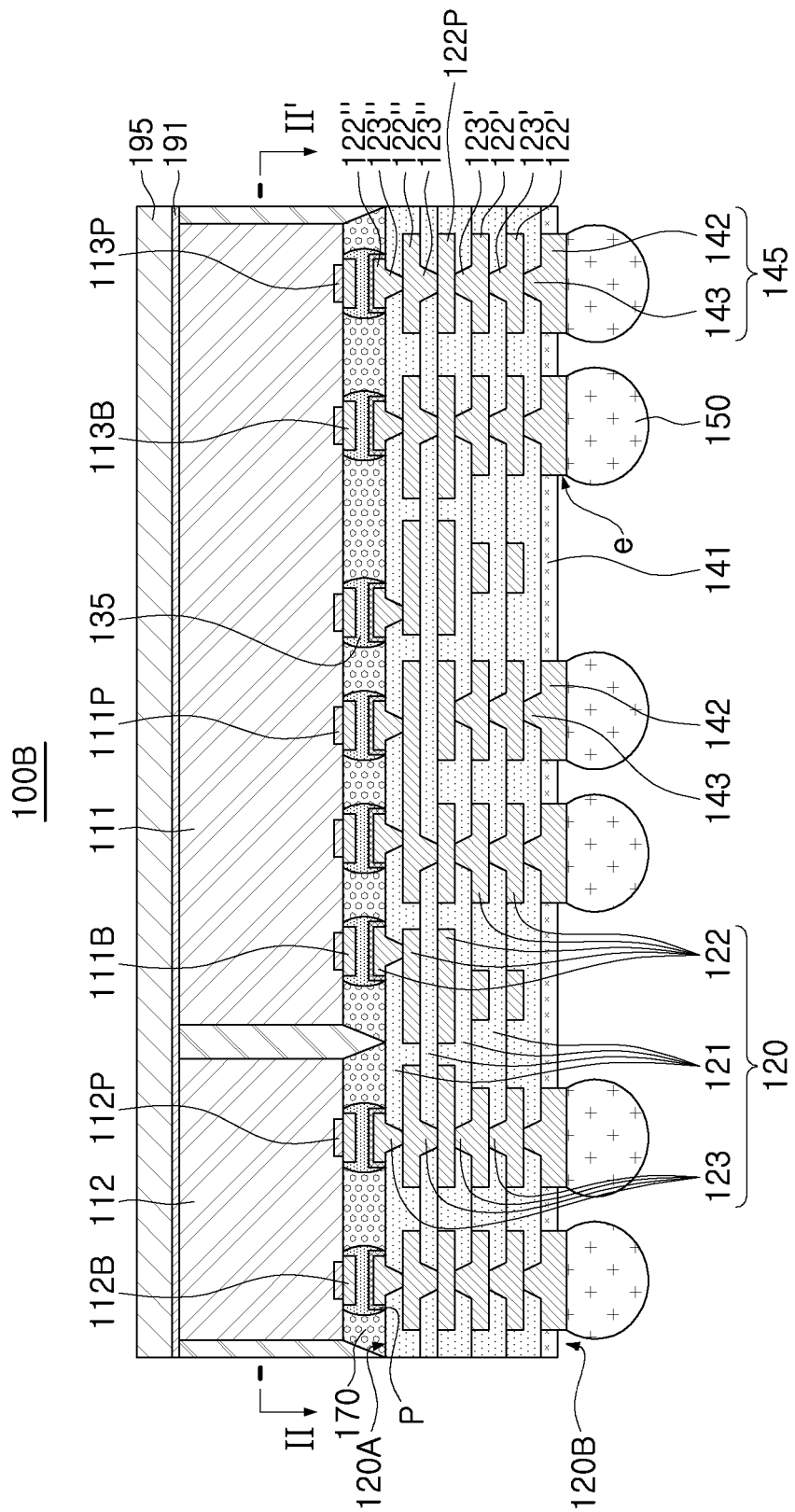
FIG. 11 is a schematic cross-sectional view illustrating a semiconductor package according to another exemplary embodiment in the present disclosure.

After the second carrier substrate 220 is removed and before the electrical connection metals 150 are formed, portions of the passivation layer 141 may be removed by a Descum or etching process to allow the UBM pads 142 to protrude from the remaining surface of the passivation layer (see FIG. 11).

The series of processes described above may be performed using a panel structure having a large area, and when a dicing process is performed after the series of processes are completed, a plurality of semiconductor packages 100A may be manufactured by performing the process once.

Figure 12:
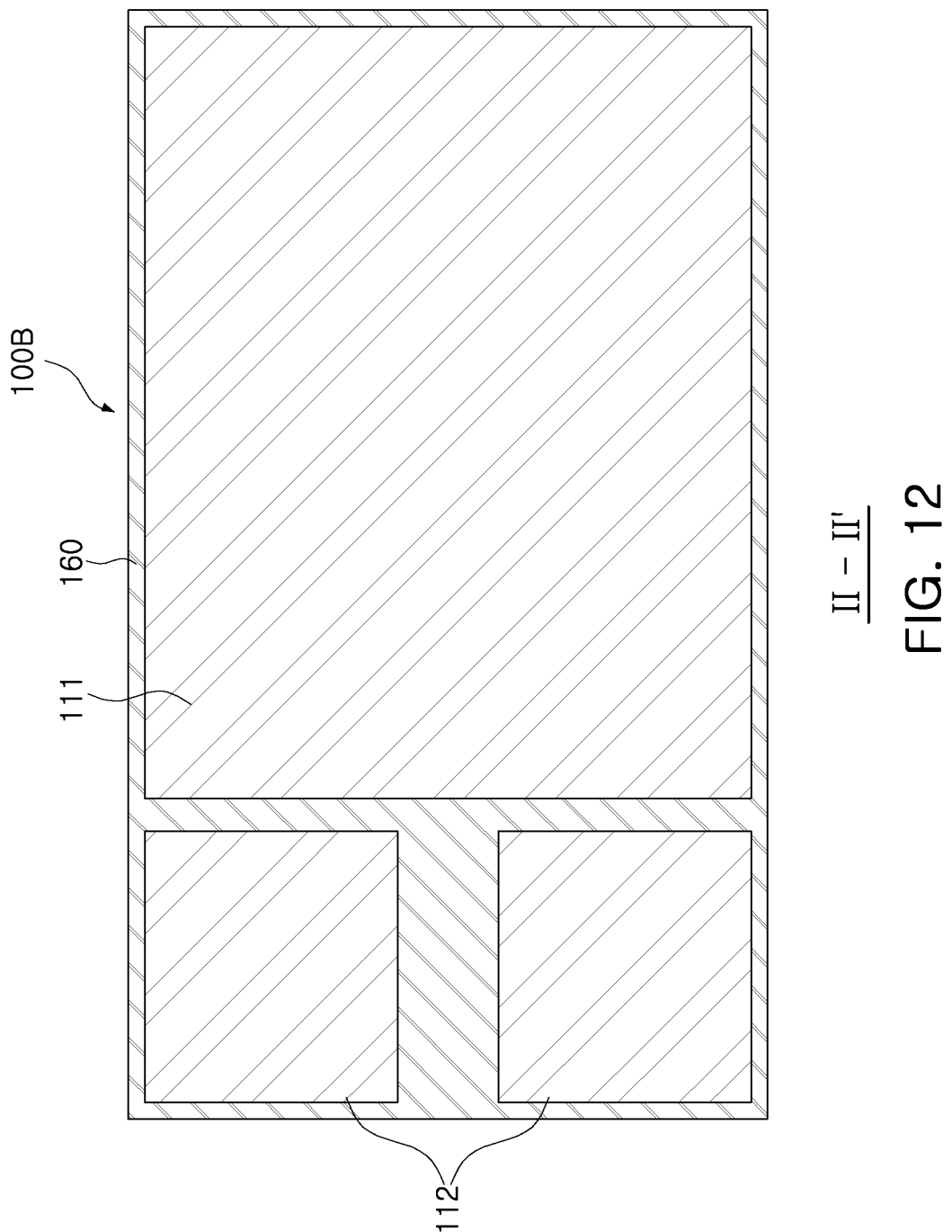
FIG. 12 is a plan view taken along line II-IF of the semiconductor package of FIG. 11.

FIG. 11 is a schematic cross-sectional view illustrating a semiconductor package according to another exemplary embodiment in the present disclosure, and FIG. 12 is a plan view taken along line II-IF of the semiconductor package of FIG. 11.

Referring to FIGS. 11 and 12, it may be understood that a semiconductor package 100B according to the present exemplary embodiment has a structure similar to that illustrated in FIGS. 6 through 8 except that different numbers of (two) redistribution layers are formed after a transfer process, another array of semiconductor chips and a heat dissipation plate are additionally used, and portions of side surfaces of UBM pads are exposed. Components according to the present exemplary embodiments may be understood with reference to the description for the same or similar components of the semiconductor package 100A illustrated in FIGS. 6 through 8 unless explicitly described otherwise.

In the semiconductor package 100B according to the present exemplary embodiment, a plurality of connection vias 123 used in the present exemplary embodiment may have different formation directions in relation to an intermediate redistribution layer 122P. In detail, two connection vias 123" adjacent to a first surface 120A among the plurality of connection vias 123 may have a tapered structure in which they become narrow toward a second surface 120B, while the other two connection vias 123' and UBM vias 143 may have a tapered structure in which they become narrow toward the first surface 120A. The connection vias 123" formed after the transfer process, that is, the connection vias 123" adjacent to the first surface 120A and having a different formation direction may be designed in various amounts corresponding to some of all the connection vias 123.

As illustrated in FIGS. 11 and 12, the semiconductor package 100B according to the present exemplary embodiment may include two second semiconductor chips 112 disposed at one side of one first semiconductor chip 111 unlike the previous exemplary embodiment. As described above, various kinds and numbers of semiconductor chips may be arranged on the connection structure 120.

A thermally conductive material layer 191 may be disposed between a heat dissipation plate 195 and the first and second semiconductor chips 111 and 112, and may be in contact with upper surfaces of the first and second semiconductor chips 111 and 112. The thermally conductive material layer 191 may help heat generated from the first and second semiconductor chips 111 and 112 to be smoothly dissipated to the heat dissipation plate 195. The thermally conductive material layer 191 may be formed of a thermal interface material (TIM). For example, the thermally conductive material layer 191 may be formed of an insulating material or be formed of a material that may include the insulating material to maintain an electrical insulating property. The thermally conductive material layer 191 may include, for example, an epoxy resin.

The heat dissipation plate 195 may be disposed on the thermally conductive material layer 191. The heat dissipation plate 195 may be, for example, a heat sink, a heat spreader, a heat pipe, or a liquid cooled cold plate.

In the present exemplary embodiment, a passivation layer 141 may partially surround side surfaces of the UBM pads 142 so that one surfaces of the UBM pads 142 and portions e of the side surfaces of the UBM pads 142 adjacent to the one surfaces of the UBM pads 142 are exposed. As described above, portions of the passivation layer 141 may be removed by a Descum or etching process to allow the UBM pads 142 to protrude from the remaining surface of the passivation layer 141.

As set forth above, according to an exemplary embodiment in the present disclosure, a transfer process using an additional carrier substrate may be introduced in a build-up process of the redistribution layers, such that an undulation problem due to the UBM layers may be significantly reduced, and the connection vias may have different formation directions in an ultimate structure. In addition, a critical dimension of a fine circuit may be satisfied by removing the undulation. In some exemplary embodiments, an additional process for exposing the UBM pads may be omitted.

While exemplary embodiments have been shown and described above, it will be apparent to those skilled in the art that modifications and variations could be made without departing from the scope of the present invention as defined by the appended claims.

What is claimed is:

1. A method of manufacturing a semiconductor package, the method comprising:
   forming a base insulating layer on a first carrier substrate;
   forming a planar conductive pattern on the base insulating layer;
   forming a redistribution structure on the base insulating layer, wherein the redistribution structure includes a plurality of insulating layers, and a plurality of redistribution layers between the plurality of insulating layers, respectively, each of the plurality of redistribution layers having a conductive via connected to an adjacent one of planar conductive pattern and the plurality of redistribution layers;
   forming an underbump metallurgy (UBM) pad on an upper surface of the redistribution structure, the UBM pad having a UBM via connected to an uppermost redistribution layer among the plurality of redistribution layers;
   attaching a second carrier substrate to the upper surface of the redistribution structure, on which the UBM pad is formed, so that the redistribution structure is provided between the first carrier substrate and the second carrier substrate;
   removing the first carrier substrate from the base insulating layer; and
   forming a connection pad on the base insulating layer, the connection pad having a connection via penetrating through the base insulating layer and connected to the planar conductive pattern.

2. The method of claim 1, wherein the UBM pad has a thickness greater than that of each of the plurality of redistribution layers.

3. The method of claim 1, wherein the connection via has a tapered structure narrowed toward a first direction, and each of the conductive via and the UBM via has a tapered structure narrowed toward a second direction opposed to the first direction.

4. The method of claim 1, further comprising, after the forming the connection pad, disposing at least one semiconductor chip on the base insulating layer to electrically connected to the connection pad.

5. The method of claim 4, further comprising, forming an encapsulant encapsulating the at least one semiconductor chip and grinding the encapsulant to expose an upper surface of the at least one semiconductor chip.

6. The method of claim 1, further comprising, before the attaching the second carrier substrate, forming a passivation layer on the upper surface of the redistribution structure to cover the UBM pad.

7. The method of claim 6, further comprising removing the second carrier substrate from the passivation layer, and exposing at least a portion of a side surface of the UBM pad from the passivation layer.

8. The method of claim 6, wherein the passivation layer includes a material different from that of each of the plurality of insulating layers.

9. The method of claim 6, wherein the passivation layer includes a same material as that of each of the plurality of insulating layers.

10. The method of claim 9, wherein the passivation layer and the plurality of insulating layers include a photo-imagable dielectric (PID).

11. The method of claim 1, wherein the UBM via has a width greater than that of the conductive via.

12. The method of claim 1, wherein each of the plurality of redistribution layers is formed along with the conductive via by a same process.

13. The method of claim 1, wherein the UBM pad is formed along with the UBM via by a same process.

14. The method of claim 1, further comprising removing the second carrier substrate.

15. A method of manufacturing a semiconductor package, the method comprising:
    forming a planar conductive pattern on a first carrier substrate;
    forming a redistribution structure on the first carrier substrate, wherein the redistribution structure includes a plurality of first insulating layers, and a plurality of redistribution layers between the plurality of first insulating layers, respectively, each of the plurality of redistribution layers having a conductive via connected to an adjacent one of planar conductive pattern and the plurality of redistribution layers;
    forming an underbump metallurgy (UBM) pad on an upper surface of the redistribution structure, the UBM pad having a UBM via connected to an uppermost redistribution layer among the plurality of redistribution layers;
    attaching a second carrier substrate to the upper surface of the redistribution structure, on which the UBM pad is formed, so that the redistribution structure is provided between the first carrier substrate and the second carrier substrate;
    removing the first carrier substrate from a lower surface of the redistribution structure, on which the planar conductive pattern is formed;
    forming a second insulating layer on the lower surface of the redistribution structure to cover the planar conductive pattern;
    forming a connection pad on the second insulating layer, the connection pad having a connection via penetrating through the second insulating layer and connected to the planar conductive pattern; and
    disposing at least one semiconductor chip on the second insulating layer to electrically connected to the connection pad.

16. The method of claim 15, wherein the UBM pad has a thickness greater than that of each of the plurality of redistribution layers, and
    the connection via has a tapered structure narrowed toward a first direction, and each of the conductive via and the UBM via has a tapered structure narrowed toward a second direction opposed to the first direction.

17. A method of manufacturing a semiconductor package, the method comprising:
    forming a planar conductive pattern on a first carrier substrate;
    forming a first redistribution structure on the first carrier substrate, wherein the first redistribution structure includes a plurality of first insulating layers, and a plurality of first redistribution layers between the plurality of first insulating layers, respectively, each of the plurality of first redistribution layers having a first conductive via connected to an adjacent one of planar conductive pattern and the plurality of first redistribution layers;
    forming an underbump metallurgy (UBM) pad on an upper surface of the first redistribution structure, the UBM pad having a UBM via connected to an uppermost redistribution layer among the plurality of first redistribution layers;
    attaching a second carrier substrate to the upper surface of the first redistribution structure, on which the UBM pad is formed, so that the first redistribution structure is provided between the first carrier substrate and the second carrier substrate;
    removing the first carrier substrate from a lower surface of the first redistribution structure, on which the planar conductive pattern is formed;
    forming a second redistribution structure on the lower surface of the first redistribution structure, wherein the second redistribution structure includes at least one second insulating layer and at least one second redistribution layer, the at least one second redistribution layer having a second conductive via connected to the planar conductive pattern;
    forming a connection pad on the second redistribution structure, the connection pad having a connection via penetrating through the at least one second insulating layer and connected to the at least one second redistribution layer; and
    disposing at least one semiconductor chip on the at least one second insulating layer to electrically connected to the connection pad.

18. The method of claim 17, wherein a number of the at least one second redistribution layer is smaller than a number of the plurality of first redistribution layers.

19. The method of claim 18, wherein the plurality of first insulating layers and the at least one second insulating layer include a photoimagable dielectric (PID).

20. The method of claim 17, wherein each of the connection via and the second conductive via has a tapered structure narrowed toward a first direction, and each of the first conductive via and the UBM via has a tapered structure narrowed toward a second direction opposed to the first direction.

* * * * *